United States Patent
Ono et al.

(10) Patent No.: US 8,460,950 B2
(45) Date of Patent: Jun. 11, 2013

(54) ORGANIC LIGHT-EMITTING DIODE

(75) Inventors: Tomio Ono, Yokohama (JP); Shintaro Enomoto, Yokohama (JP); Yukitami Mizuno, Tokyo (JP); Isao Takasu, Komae (JP); Yasushi Shinjo, Kawasaki (JP); Shuichi Uchikoga, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 364 days.

(21) Appl. No.: 12/717,441

(22) Filed: Mar. 4, 2010

(65) Prior Publication Data

US 2010/0244002 A1 Sep. 30, 2010

(30) Foreign Application Priority Data

Mar. 25, 2009 (JP) ................. 2009-074743

(51) Int. Cl.
*H01L 21/00* (2006.01)
(52) U.S. Cl.
USPC ............. 438/22; 438/29; 438/99; 257/40; 257/E51.018; 257/E51.041
(58) Field of Classification Search
USPC ............. 257/40, E51.018, E51.042; 438/22, 438/29, 99
See application file for complete search history.

(56) References Cited

U.S. PATENT DOCUMENTS

| | | | |
|---|---|---|---|
| 2004/0155238 A1* | 8/2004 | Thompson et al. | 257/40 |
| 2006/0257684 A1* | 11/2006 | Arakane et al. | 428/690 |
| 2011/0207255 A1* | 8/2011 | Sakakura et al. | 438/34 |

FOREIGN PATENT DOCUMENTS

| | | | |
|---|---|---|---|
| EP | 1202608 A2 * | 5/2002 | |
| JP | 2007-42314 | 2/2007 | |
| JP | 2007-305783 | 11/2007 | |

OTHER PUBLICATIONS

Shi-Jian Su, et al. "Highly Efficient Organic Blue-and White-Light-Emitting Devices Having a Carrier- and Exciton-Confining Structure for Reduced Efficiency Roll-Off." Advanced Materials, vol. 20, No. 21, 2008, pp. 4198-4193.
Japanese Office Action issued Aug. 30, 2011, in Patent Application No. 2009-074743. (with English translation).

* cited by examiner

*Primary Examiner* — Matthew Landau
*Assistant Examiner* — Colleen E Snow
(74) *Attorney, Agent, or Firm* — Oblon, Spivak, McClelland, Maier & Neustadt, L.L.P.

(57) ABSTRACT

An organic light-emitting diode includes an anode and a cathode separately arranged from each other, and an emission layer between the anode and the cathode, the emission layer including a single host material and a light-emitting material, the emission layer including, when the host material has a hole transport property, a doped region on a cathode side to which an electron transport material is doped and an undoped region on an anode side to which an electron transport material is not doped, or the emission layer including, when the host material has an electron transport property, a doped region on an anode side to which a hole transport material is doped and an undoped region on a cathode side to which a hole transport material is not doped.

4 Claims, 3 Drawing Sheets

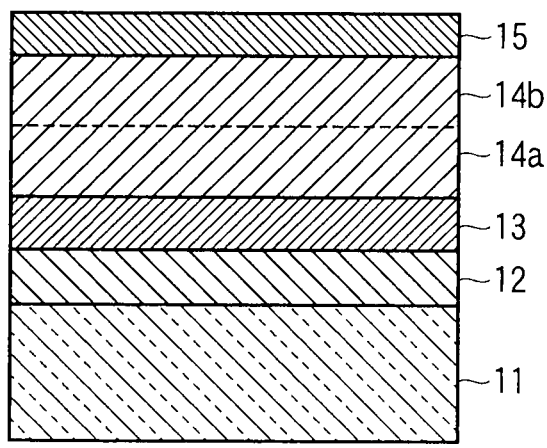
F I G. 1A
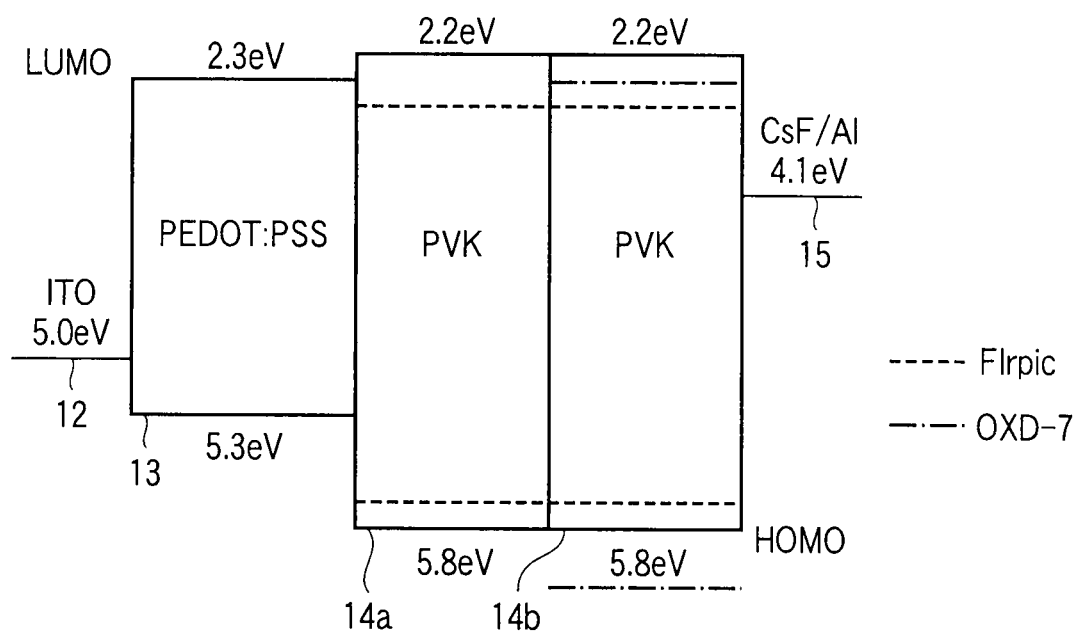
F I G. 1B

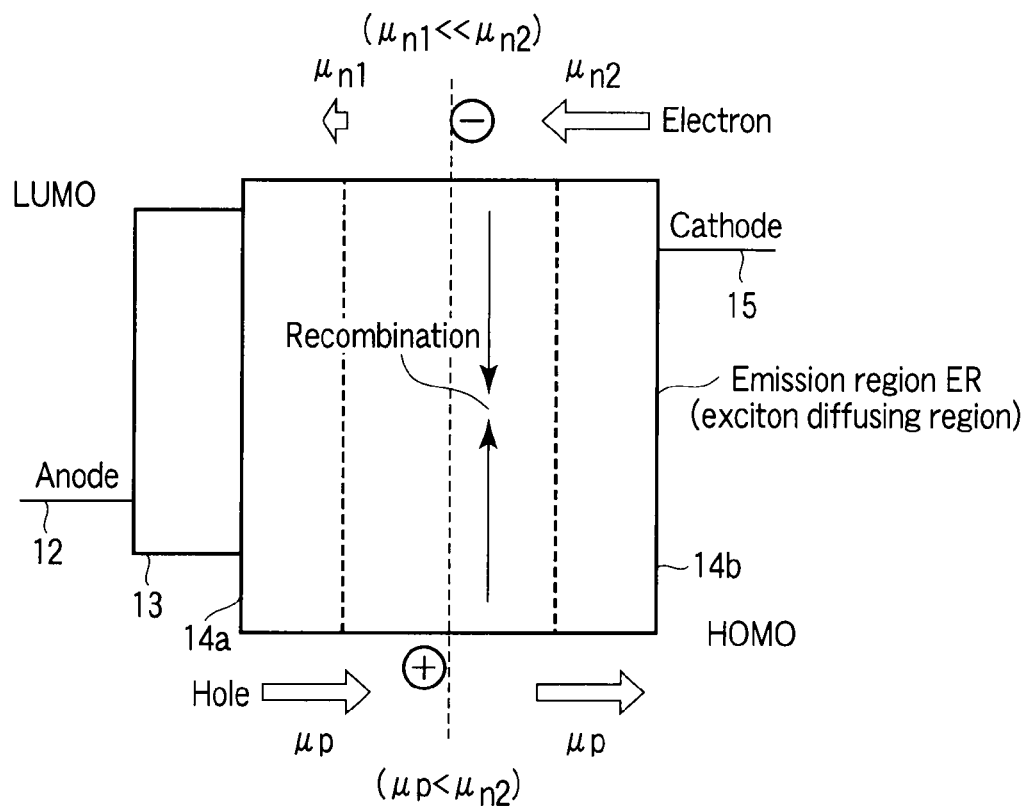
F I G. 2
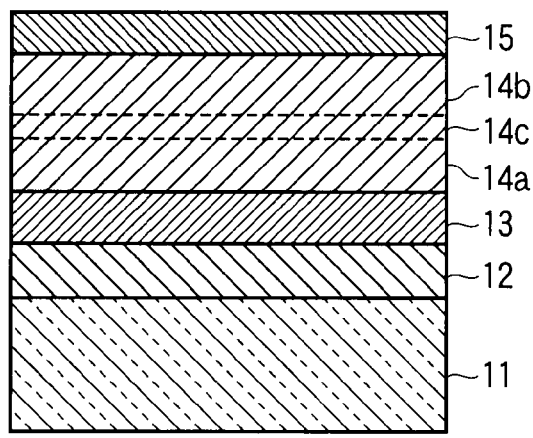
F I G. 3

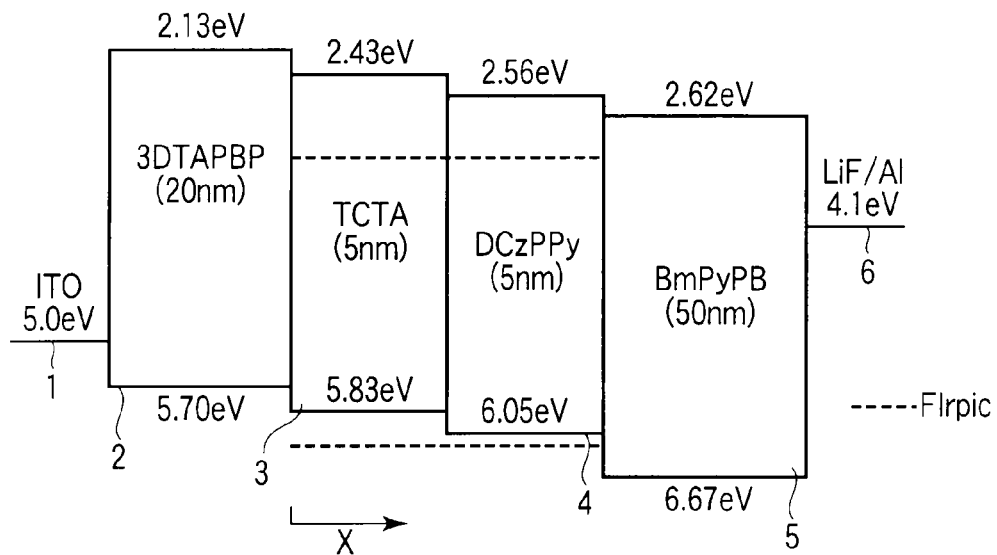
F I G. 4
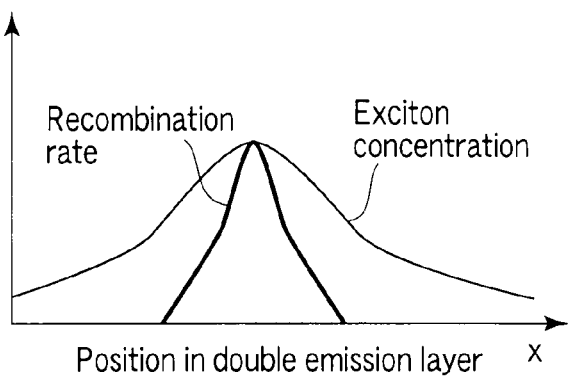
F I G. 5A
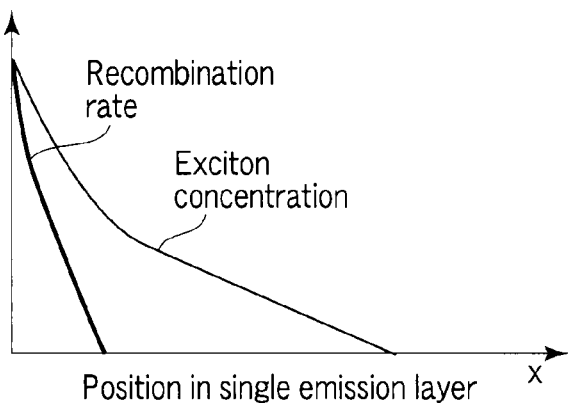
F I G. 5B

ORGANIC LIGHT-EMITTING DIODE

CROSS-REFERENCE TO RELATED APPLICATIONS

This application is based upon and claims the benefit of priority from prior Japanese Patent Application No. 2009-074743, filed Mar. 25, 2009, the entire contents of which are incorporated herein by reference.

BACKGROUND OF THE INVENTION

1. Field of the Invention

The present invention relates to a light-emitting diode using an organic material and is applicable to a planar light source and the like.

2. Description of the Related Art

In recent years, organic light-emitting diodes (OLEDs) have been attracting attention in view of applications to a planar light source and the like. An OLED has a structure that an emission layer of a thin film comprising organic materials is interposed between two electrodes of a cathode and an anode. The OLED operates as follows: When a voltage is applied between the cathode and the anode, electrons and holes are injected to the emission layer from the cathode and the anode, respectively, and excitons are produced in the emission layer through recombination of electrons and holes. When the excitons are radiatively deactivated, light emission is caused. The OLED utilizes the light emission. In particular, OLEDs using phosphorescence have been actively studied since they have high luminous efficiency.

However, a phosphorescent OLED is deficient in that high luminous efficiency cannot be obtained at high luminance regions, which is important in a practical device, since luminous efficiency decreases significantly as current density increases.

To solve this problem, an OLED having the structure shown in FIG. 4 has been developed. See, Advanced Materials, vol. 20, No. 21, p. 4189 (2008). As is shown in FIG. 4, the anode (indium tin oxide, ITO) 1, the hole transport layer 2 comprising a hole transport material (3DTAPBP), the first emission layer 3 comprising a first host material (TCTA) and a light-emitting material (FIrpic), the second emission layer 4 comprising a second host material (DCzPPy) and the light-emitting material, the electron transport layer 5 comprising an electron transport material (BmPyPB), and the cathode (LiF/Al) 6 are formed in this order. This OLED comprises two-layered emission layers. When a voltage is applied between the cathode and the anode, holes and electrons are injected from the anode and cathode, respectively, and are recombined within the emission layers to produce excitons, leading to light emission.

FIGS. 5A and 5B show recombination rate and exciton concentration for an OLED comprising two-layered emission layers (hereinafter, referred to as a double emission layer) shown in FIG. 4, and for an OLED comprising a single emission layer.

In general, triplet excitons produced in a phosphorescent material are annihilated without light emission, which is in proportion to the square of the concentration. Thus, when the current density is increased such that the exciton concentration is increased, resulting collisions of excitons decrease luminous efficiency.

In the case of the single emission layer shown in FIG. 5B, recombination of holes and electrons is caused in either the anode or cathode side of the emission layer, depending on the relationship between the mobilities of holes and electrons in the host material. Therefore, the excitons produced through recombination can diffuse in only one direction. This increases the maximum exciton concentration and rate of non-radiative annihilation and so decreases the efficiency.

In the case of the double emission layer shown in FIG. 5A, recombination is caused in the interface between the first emission layer 3 and second emission layer 4, that is, in the central portion of the double emission layer, because of the energy gap between the two host materials. Thus, excitons can diffuse from the central portion of the double emission layer in two directions: toward the anode and cathode sides. Therefore, in comparison with the single emission layer, it can lower the maximum exciton concentration resulting in decrease of the rate of non-radiative annihilation, thereby achieving the improvement in the luminous efficiency.

In a phosphorescent OLED having a double emission layer, high luminous efficiency has been obtained at high luminances, but it is still not satisfactory. This is because there are emission centers in the interface between the two emission layers each comprising different type of host material, where problems such as trapping of electrons and holes and non-radiative deactivation of excitons are caused, which tends to lower the luminous efficiency. Another problem is that concentration of recombination and emission centers in a narrow region of the interface, though it is in the central portion of the emission layer, raises maximum exciton concentration and lowers the luminous efficiency and lifetime.

BRIEF SUMMARY OF THE INVENTION

According to an embodiment of the present invention, there is provided an organic light-emitting diode, comprising: an anode and a cathode separately arranged from each other; and an emission layer between the anode and the cathode, the emission layer containing a single host material and a light-emitting material, the emission layer comprising, when the host material has a hole transport property, a doped region on a cathode side to which an electron transport material is doped and an undoped region on an anode side to which an electron transport material is not doped, or the emission layer comprising, when the host material has an electron transport property, a doped region on an anode side to which a hole transport material is doped and an undoped region on a cathode side to which a hole transport material is not doped.

According to an embodiment of the present invention, there is provided a method of manufacturing an organic light-emitting diode comprising an anode and a cathode separately arranged from each other, and an emission layer between an anode and cathode, the emission layer containing a single host material and a light-emitting material, the method comprising: applying, to an anode side, a solution prepared by dissolving a host material having a hole transport property and a light-emitting material in a first solvent to form an undoped region on an anode side of the emission layer to which an electron transport material is not doped; and applying, to the undoped region, a solution prepared by dissolving a host material having a hole transport property, light-emitting material and an electron transport material in a second solvent to form a doped region on a cathode side of the emission layer to which an electron transport material is doped.

BRIEF DESCRIPTION OF THE SEVERAL VIEWS OF THE DRAWING

FIG. 1A is a cross-sectional view of an OLED of the first embodiment and FIG. 1B is an energy band diagram thereof;

FIG. 2 is a diagram showing operation of the OLED of the first embodiment;

FIG. 3 is a cross-sectional view of an OLED of the second embodiment;

FIG. 4 is an energy band diagram of a conventional OLED; and

FIGS. 5A and 5B are graphs showing recombination rate and exciton concentration with respect to a conventional OLED having a double emission layer and a conventional OLED having a single emission layer, respectively.

DETAILED DESCRIPTION OF THE INVENTION

Embodiments of the present invention are described below with reference to drawings.

First Embodiment

FIG. 1A is a cross-sectional view of an OLED according to a first embodiment. On a glass substrate 11, an anode 12 made of ITO is formed, and a hole injection layer 13 comprising a hole transport material polyethylenedioxythiophene: polystyrene sulfonate (PEDOT:PSS) is formed thereon. On the hole injection layer 13, an emission layer 14 comprising a first region or undoped region 14a and a second region or doped region 14b is formed. Both the first region 14a and second region 14b of the emission layer 14 comprise a light-emitting material bis(2-(4,6-difluorophenyl)pyridinato iridium (III) (FIrpic) in a hole transport material polyvinyl carbazole (PVK) as a host material, and the first region 14a formed on the side of anode 12 does not comprise an electron transport material and the second region 14b formed on the side of anode 12 comprises an electron transport material 1,3-bis(2-(4-tertiary-butylphenyl)-1,3,4-oxydiazol-5-yl)-benzene (OXD-7). A cathode 15 made of CsF and Al is formed on the emission layer 14.

The following are chemical formulae of the host material polyvinyl carbazole PVK and the light-emitting material FIrpic.

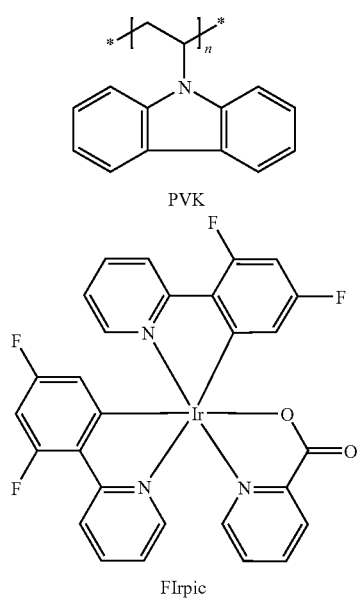

PVK

FIrpic

The anode 12 is formed by sputtering. The hole injection layer 13 is formed by spin-coating with an aqueous solution of PEDOT:PSS. The first region (undoped region) 14a of the emission layer 14 is formed by spin-coating with a solution prepared by dissolving PVK and FIrpic in a first solvent xylene. The second region (doped region) 14b of the emission layer 14 is formed by spin-coating with a solution prepared by dissolving PVK, FIrpic and OXD-7 in a second solvent toluene. Toluene used as the second solvent, in forming the second region 14b of the emission layer 14, has a high evaporation rate, and thus evaporates before the first region 14a of the emission layer 14 is dissolved therein. The cathode 15 is formed by vacuum evaporation.

FIG. 1B is an energy band diagram of the OLED of the first embodiment. As is shown in FIG. 1B, the emission layer 14 comprises a hole transport material PVK as a single host material and FIrpic as a light-emitting material, and thus the highest occupied molecular orbital (HOMO) and lowest unoccupied molecular orbital (LUMO) of both materials are at the same level in both the first region 14a and second region 14b of the emission layer 14. On the other hand, an electron transport material OXD-7 is doped only in the second region 14b of the emission layer 14 formed on the side of cathode 15.

FIG. 2 shows operation of the OLED of the first embodiment. As is shown in FIG. 2, holes and electrons are injected from the anode 12 and cathode 15, respectively, through application of voltage, and are recombined in the emission layer 14 to form excitons resulting in light emission.

Here, the first region 14a of the emission layer 14 comprises the hole transport material PVK and the light-emitting material FIrpic, and it exhibits only a hole transport property since the electron transport material OXD-7 is not doped. The hole mobility and electron mobility in the first region 14a are defined as $\mu_p$ and $\mu_{n1}$, respectively. On the other hand, the second region 14b of the emission layer 14 has an electron transport property as well as a hole transport property since the electron transport material OXD-7 is doped in addition to the hole transport material PVK and the light-emitting material FIrpic. The hole mobility and electron mobility in the second region 14b are defined as $\mu_p$ and $\mu_{n2}$, respectively. Here, the relationship between the electron mobility of the first region 14a and that of the second region 14b is indicated by $\mu_{n1} \ll \mu_{n2}$. In this case, the degree of the electron transport property in the second region 14b can be changed by adjusting the doping concentration of OXD-7 in the second region 14b of the emission layer 14, and the electron mobility in the second region 14b can be made greater than the hole $\mu_p < \mu_{n2}$ can be satisfied. Consequently, electrons injected into the second region 14b are accumulated in the vicinity of the interface between the first region 14a and second region 14b where the change of the electron mobility occurs, and are combined with the holes injected in the first region 14a of the emission layer 14 in the vicinity thereof. The excitons formed by recombination between electrons and holes can move in both directions toward the anode 12 and cathode 15, and thus an emission region ER can be extended to both sides from the central portion of the emission layer 14.

In the OLED of this embodiment, the emission layer 14 overall comprises a hole transport material PVK as a single host material and a light-emitting material FIrpic. Thus, unlike the conventional OLED shown in FIG. 4, the OLED of this embodiment can avoid problems of reduction in the luminous efficiency and lifetime caused in the case where the recombination and emission centers are produced in the interface between two emission layers each comprising different type of host material. Further, the OLED of this embodiment also enables recombination and emission centers to be produced in the vicinity of the central portion of the emission layer 14 by doping the electron transport material OXD-7 in the second region 14b only, and enables extension of the luminous region to both sides from the central portion of emission layer 14. Thus, the maximum value of the exciton concentration is decreased, resulting in decrease in the rate of non-radiative annihilation, thereby achieving improvement in the efficiency.

In the meanwhile, if the material for the first region 14a and that for the second region 14b are dissolved in the same solvent, there is no distinct interface between the first region 14a and second region 14b since the first region 14a is partially dissolved in application of the solution for the second region 14b onto the first region 14a. However, this does not become problematic if the first region 14a and second region 14b only partially mix. Even such an OLED essentially operates as described above.

Second Embodiment

FIG. 3 is a cross-sectional view of the OLED of a second embodiment. In FIG. 3, the parts corresponding to those of FIG. 1A are indicated by the same reference numbers as those of FIG. 1A, and the detailed explanation thereof is omitted.

The OLED of this embodiment has a similar structure to that of the OLED of the first embodiment except that the third region 14c is provided between the first region 14a and second region 14b of the emission layer 14. The third region 14c, as is the case with the second region 14b, comprises a hole transport material PVK as a host material, a light-emitting material FIrpic, and an electron transport material OXD-7, but the doping concentration of OXD-7 is lower than that of the second region 14b. Consequently, the doping concentration of OXD-7 is made higher on a side close to the cathode 15 and is made lower in the central portion of the emission layer 14.

Also in the OLED of this embodiment, the emission layer 14 overall comprised the hole transport material PVK as a single host material and the light-emitting material FIrpic. Thus, unlike the conventional OLED shown in FIG. 4, it can avoid problems of reduction in the luminous efficiency and lifetime caused in the case where the recombination and emission centers are produced in the interface between the two emission layers each comprising different type of host material. Moreover, it also enables further extension of the width of the recombination and emission centers by changing the electron mobilities in plural stages by providing distribution of the doping concentration of the electron transport material OXD-7 between the second region 14b and the third region 14c. Thus, the maximum exciton concentration is decreased resulting in decrease in the rate of non-radiative annihilation, thereby achieving improvement in the efficiency.

The present invention is not limited to the aforementioned embodiments. In the aforementioned embodiments the emission layer is formed by applying a mixture of a host material, light-emitting material, and carrier transport material, but, for example, it may be formed by coevaporatin of low molecular materials.

Examples of a hole transport host material and electron transport host material having low molecular weights are indicated below.

[Hole transport host materials]

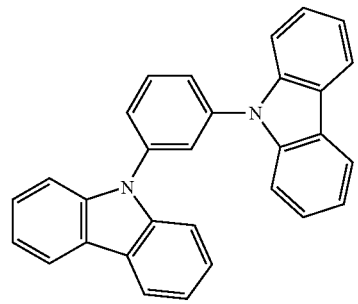

1,3-bis(carbazol-9-yl)benzene

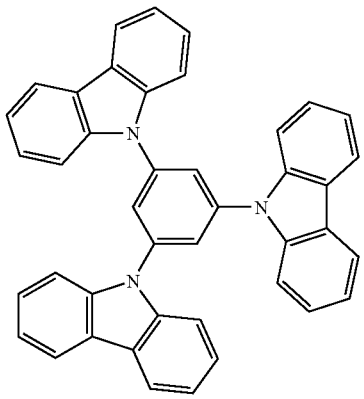

1,3,5-tris(carbazol-9-yl)benzene

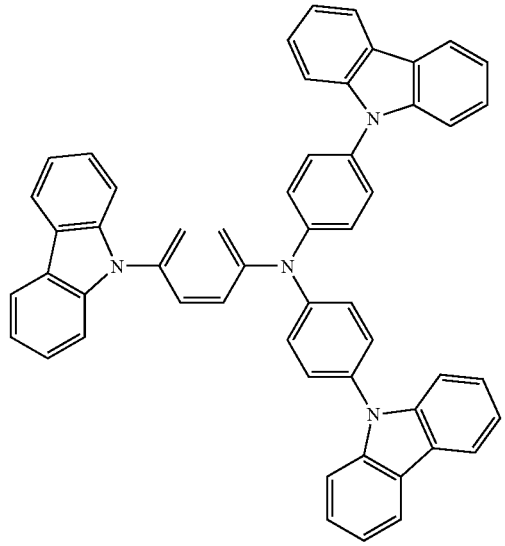

4,4',4''-tris(carbazol-9-yl)triphenylamine

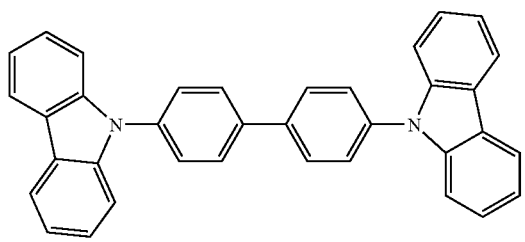

4,4'-bis(carbazol-9-yl)biphenyl

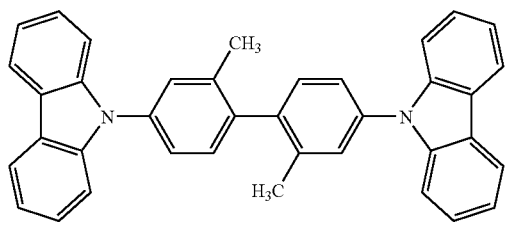

4,4'-bis(9-carbazolyl)-2,2'-dimethylbiphenyl

[Electron transport host materials]

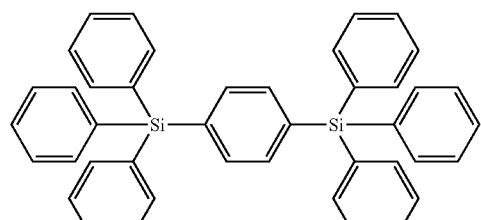

1,4-bis(triphenylsilyl)benzene

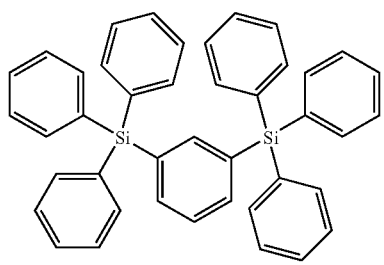

1,3-bis(triphenylsilyl)benzene

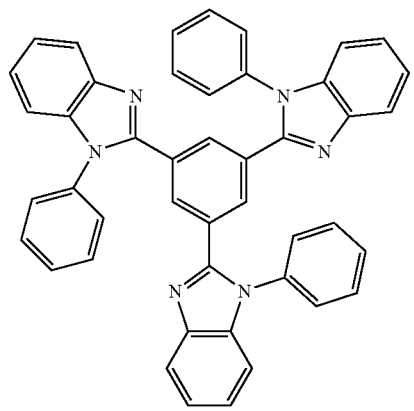

2,2',2''-(1,3,5-benzenetriyl)-
tris(1-phenyl-1H-benzoimidazole)

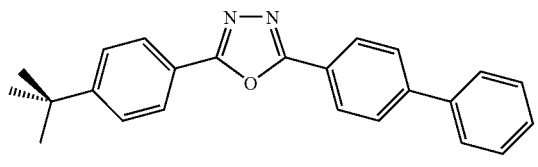

2-(4-biphenylyl)-5-(4-tert-butylphenyl)-1,3,4oxadiazole

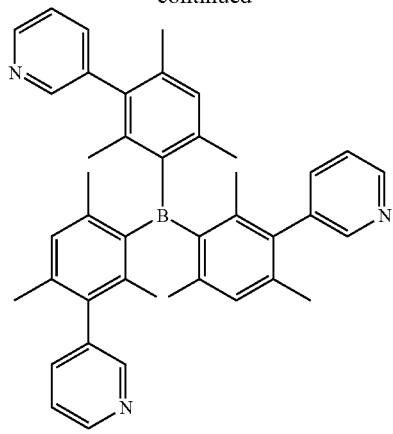

tris(2,4,6-trimethyl-3-pyridine-3-yl)phenylborane

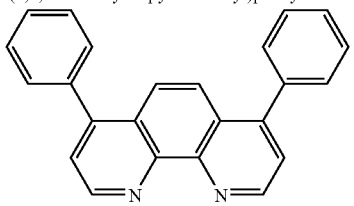

4,7-diphenyl-1,10-phenanthroline

In the aforementioned embodiments, a part of the emission layer is formed by mixing PVK, OXD-7 and FIrpic, but it may be formed, for example, by mixing copolymer having carbazole units and OXD-7 units and FIrpic.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An organic light-emitting diode, comprising:
    an anode and a cathode separately arranged from each other; and
    an emission layer between the anode and the cathode,
    the emission layer comprising, when a host material has a hole transport property, a doped region on a cathode side and an undoped region on an anode side, the doped region comprising the single host material, a light-emitting material and an electron transport material, and the undoped region comprising the single host material and the light-emitting material and no electron transport material, or
    the emission layer comprising, when a host material has an electron transport property, a doped region on an anode side and an undoped region on a cathode side, the doped region comprising the single host material, a light-emitting material and a hole transport material, and the undoped region comprising the single host material and the light-emitting material and no hole transport material.

2. The organic light-emitting diode according to claim 1, wherein a doping concentration of the electron transport material in the doped region of the emission layer is higher on a side close to the cathode and is lower in a central portion of the emission layer when the host material has a hole transport property, or wherein a doping concentration of the hole transport material in the doped region of the emission layer is higher on a side close to the anode and is lower in a central portion of the emission layer when the host material has an electron transport property.

3. The organic light-emitting diode according to claim 1, wherein the host material is polyvinylcarbazole having a hole transport property and the electron transport material is 1,3-bis(2-(4-tert-butylphenyl)-1,3,4-oxydiazol-5-yl)-benzene.

4. A method of manufacturing an organic light-emitting diode comprising an anode and a cathode separately arranged from each other, and an emission layer between an anode and cathode, the emission layer containing a single host material and a light-emitting material, the method comprising:
  applying, to an anode side, a solution prepared by dissolving a host material having a hole transport property and a light-emitting material in a first solvent to form an undoped region on an anode side of the emission layer to which an electron transport material is not doped; and
  applying, to the undoped region, a solution prepared by dissolving a host material having a hole transport property, light-emitting material and an electron transport material in a second solvent to form a doped region on a cathode side of the emission layer to which an electron transport material is doped, wherein the cathode directly contacts the doped region.

* * * * *